(12) United States Patent
Andrews et al.

(10) Patent No.: US 7,262,630 B1
(45) Date of Patent: Aug. 28, 2007

(54) PROGRAMMABLE TERMINATION FOR SINGLE-ENDED AND DIFFERENTIAL SCHEMES

(75) Inventors: William B. Andrews, Emmaus, PA (US); Barry K. Britton, Orefield, PA (US); John Schadt, Bethlehem, PA (US); Mou C. Lin, Clinton, NJ (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 108 days.

(21) Appl. No.: 11/194,356

(22) Filed: Aug. 1, 2005

(51) Int. Cl.
*H03K 19/003* (2006.01)
(52) U.S. Cl. .......................................... 326/30; 326/26
(58) Field of Classification Search ................. 326/30, 326/26, 31
See application file for complete search history.

(56) References Cited

U.S. PATENT DOCUMENTS

| | | | |
|---|---|---|---|
| 5,705,937 A * | 1/1998 | Yap .............................. | 326/30 |
| 6,051,989 A * | 4/2000 | Walck .......................... | 326/30 |
| 6,480,026 B2 | 11/2002 | Andrews | |
| 6,700,823 B1 | 3/2004 | Rahman et al. ........ | 365/189.05 |
| 7,038,498 B2 * | 5/2006 | Funaba ......................... | 327/77 |
| 7,138,822 B2 * | 11/2006 | Ritchie et al. ................ | 326/30 |

OTHER PUBLICATIONS

U.S. Appl. No. 10/397,669, filed Mar. 26, 2003.

* cited by examiner

*Primary Examiner*—James H. Cho
(74) *Attorney, Agent, or Firm*—Steve Mendelsohn (57) ABSTRACT

In one embodiment of the invention, a programmable termination structure has first and second termination circuits for corresponding pads and a programmable connection therebetween. The first termination circuit supports first and second sets of termination schemes. A shared resistor is part of at least one termination scheme in each set. The first termination circuit supports a termination scheme between the first pad and a user-defined node connected to an on-chip capacitor such that first pad is connected via the termination scheme to the on-chip capacitor. Control circuitry automatically turns on and off a termination scheme for bidirectional signaling supported by the first termination circuit, wherein (1) the control circuitry turns off the termination scheme if an output buffer is configured to present outgoing signals at the first pad and (2) the control circuitry turns on the termination scheme if the output buffer is disabled in order to terminate incoming signals received at the first pad.

30 Claims, 3 Drawing Sheets

PROGRAMMABLE TERMINATION FOR SINGLE-ENDED AND DIFFERENTIAL SCHEMES

CROSS-REFERENCE TO RELATED APPLICATIONS

The subject matter of this application is related to:
U.S. Pat. No. 6,480,026, issued Nov. 12, 2002;
U.S. patent application Ser. No. 10/397,669, filed Mar. 26, 2003;
U.S. patent application Ser. No. 10/628,657, filed Jul. 28, 2003; and
U.S. patent application Ser. No. 10/671,378, filed Sep. 25, 2003, the teachings of all four of which are incorporated herein by reference.

TECHNICAL FIELD

The present invention relates to programmable devices, such as field-programmable gate arrays (FPGAs), and, in particular, to the input/output (I/O) interfaces for such devices.

BACKGROUND

Field-programmable gate arrays are a particular type of programmable device that provides functional flexibility to the user. As opposed to an application-specific integrated circuit (ASIC) or other similar device in which the functionality is "hard-wired" in the device, an FPGA allows a user to program the device to support a relatively wide range of functionality. One of the main advantages of FPGAs over ASICs is that a single FPGA hardware design can provide user-programmable functionality to support many different applications, while an ASIC is limited to the particular functions that are hard-wired into the device at the time of fabrication.

In order to communicate with other components, an FPGA must be able to transmit outgoing signals to and/or receive incoming signals from those other components. There are many different signaling standards in use today that define protocols for signal communications between components. For example, different signaling standards may rely on symmetric or non-symmetric differential or complementary signaling having different sets of voltage levels corresponding to data true, data complement, and the intermediate common-mode voltage.

A particular signal-processing system might conform to a particular signaling standard for its inter-component communications. In that case, all of the components in the system would ideally be compatible with that particular signaling standard so that all inter-component communications within the system would conform to that signaling standard.

In the past, an FPGA would be designed to operate in systems that conform to a particular set of signaling standards. Such an FPGA would be able to transmit and/or receive signals conforming to those particular signaling standards. In order for that same FPGA to be configured to operate in a system that conforms to some other signaling standard (outside of the supported set), additional hardware, external to the FPGA (e.g., a board-level discrete device), would have to be provided in order to convert (1) incoming signals (i.e., signals transmitted to the FPGA from other system components) from the system's signaling standard to the different signaling standard supported by the FPGA and (2) outgoing signals (i.e., signals transmitted from the FPGA and intended for other system components) from the FPGA's signaling standard to the system's different signaling standard. Alternatively, a different FPGA would have to be designed to support the system's different signaling standard.

As silicon devices become smaller and faster, device I/O speeds and signal integrity requirements increase. One thing that helps signal integrity and speed is to use terminated interface standards, such as Stub Series Termination Logic or High-Speed Transceiver Logic. The use of impedance and termination helps (1) match board traces thereby reducing reflections and (2) dampen ringing. The closer the termination is to the receiver and driver circuits, the greater the effect. When routing a bus from one chip to another, it helps to match the routing between the bus signals, to minimize the delay skew between the different board routes. Having the termination on the chip rather than on the board reduces the amount of board routing, thereby keeping the skew to a minimum.

One of the most common termination schemes used today is to terminate the board trace at the driver or receiver or both using a resistor to halve the power supply of the driving circuit. The terminating resistor value is set to be equal to the board trace impedance, which is typically 50 ohms. Devices that implement these terminations on the silicon chip, typically use thevenin equivalent circuits, which use more power than non-thevenin termination schemes.

As device sizes shrink, the cost of silicon area increases and the signaling requirements of I/O circuits also increase. In particular, I/O circuits are often required to run faster and support multiple interface standards that require the circuits to use device technologies that do not shrink as fast as the cores devices on the silicon chip.

Low-voltage differential signal schemes are often used to meet increased signaling speed requirements. The reduced signal swing of differential standards allows them to run faster. The differential attribute of the signaling allows them to work in noise environments due to their common-mode noise immunity. Differential signaling schemes work on the premise of one signal's relative potential to the other. Common-mode phenomena such as ground bounce and power droop affect both differential signals together. As the common mode of the differential signals is disturbed, the relative potential of one signal to the other is not. This allows differential signaling to work where single-ended or terminated standards might not.

One way to increase signal integrity of high-speed differential signaling is to use common-mode termination for the differential termination of the receiver. Conventionally, a differential resistor with a common-mode termination uses an external capacitor connected to ground, which allows AC-effects of the common-mode noise to be shunted to ground. Conventional common-mode termination requires extra pads on the silicon to be bonded for the external capacitors.

Due to increased I/O speed requirements and signal integrity requirements, interface standards continue to change. Although differential signaling offers higher speeds and better common-mode noise rejection, they come at a cost of double the interface signals and pads. There is still a realm of performance that requires good speed and signal integrity without the cost of doubling the interface size. Terminated single-ended standards are used for just such interfaces.

One of the newer interface standards requires a dynamic termination scheme involving a bidirectional interface, where the termination is off when the output driver is on and the termination is on when the output driver is off, to enable receipt of an incoming signal. In these types of bidirectional interfaces, a conventional approach is to have each side terminate when it is not driving. This is not available on board because the board does not have access to a signal that states when one or the other device is driving on the board.

As mentioned above, one approach being used today is on-chip thevenin termination with the cost of increased power. By increasing the number of power and ground pins on a chip to meet the power requirements for thevenin termination, the signal-pin-to-power-pin ratio is reduced and therefore the number of signals available on the device for I/O interfaces is reduced. Another approach being used today is off-chip, on-board terminations. These devices are external discrete devices on the board, although this comes at the cost of increased board complexity, routing, and skew, and therefore increased design time and financial cost.

External discrete-device differential termination resistors are also available today but are farther from the receiver and therefore reduce the effectiveness of signal integrity at the receiver. Differential termination schemes are available today with and without common-mode termination both on- and off-chip. The devices available today are costly in resources due to the fact that the differential termination is either a separate circuit on the silicon device with no sharing of resources or a thevenin equivalent scheme with a fixed common-mode termination voltage. The negative effect of a fixed common-mode termination is that the driver's common mode may be different, which could impact the driver's duty cycle and performance. If the driver had a more advance design with an op-amp to control the common mode of the output signal, then the op-amp could go unstable.

SUMMARY

In one embodiment, the present invention is an integrated circuit having a programmable termination structure (e.g., 100 of FIG. 1) for a first pad (e.g., PAD A) and a second pad (e.g., PAD B). The termination structure comprises a first termination circuit (e.g., R1A-R5A) associated with the first pad, a second termination circuit (e.g., R1B-R5B) associated with the second pad, and a programmable connection (e.g., R5) between the first and second termination circuits. The first termination circuit supports first and second sets of termination schemes. The first set of termination schemes comprises one or more of (1) at least one single-ended non-thevenin pull-up termination (e.g., R3A, R1A) between the first pad and a reference power voltage (e.g., PWR), (2) at least one single-ended non-thevenin pull-down termination (e.g., R3A, R2A) between the first pad and a reference ground node (e.g., GND), and (3) at least one single-ended thevenin termination (e.g., R3A, R1A, R2A) between the first pad and (i) the reference power node and (ii) the reference ground node. The second set of termination schemes comprises one or more of (1) at least one single-ended non-thevenin user-defined termination (e.g., R3A, R4A, R5A) between the first pad and a user-defined node (e.g., VTT), (2) at least one single-ended thevenin termination (e.g., R3A, R4A, R5A, R2A, R1A) between the first pad and (i) the user-defined node and (ii) at least one of the reference power node and the reference ground node, and (3) at least one differential termination between the first and second pads (e.g., R3A, R4A, R5, R4B, R3B). The first termination circuit comprises a shared resistor (e.g., R3A) that is part of at least one termination scheme in the first set and at least one termination scheme in the second set.

Figure 1:
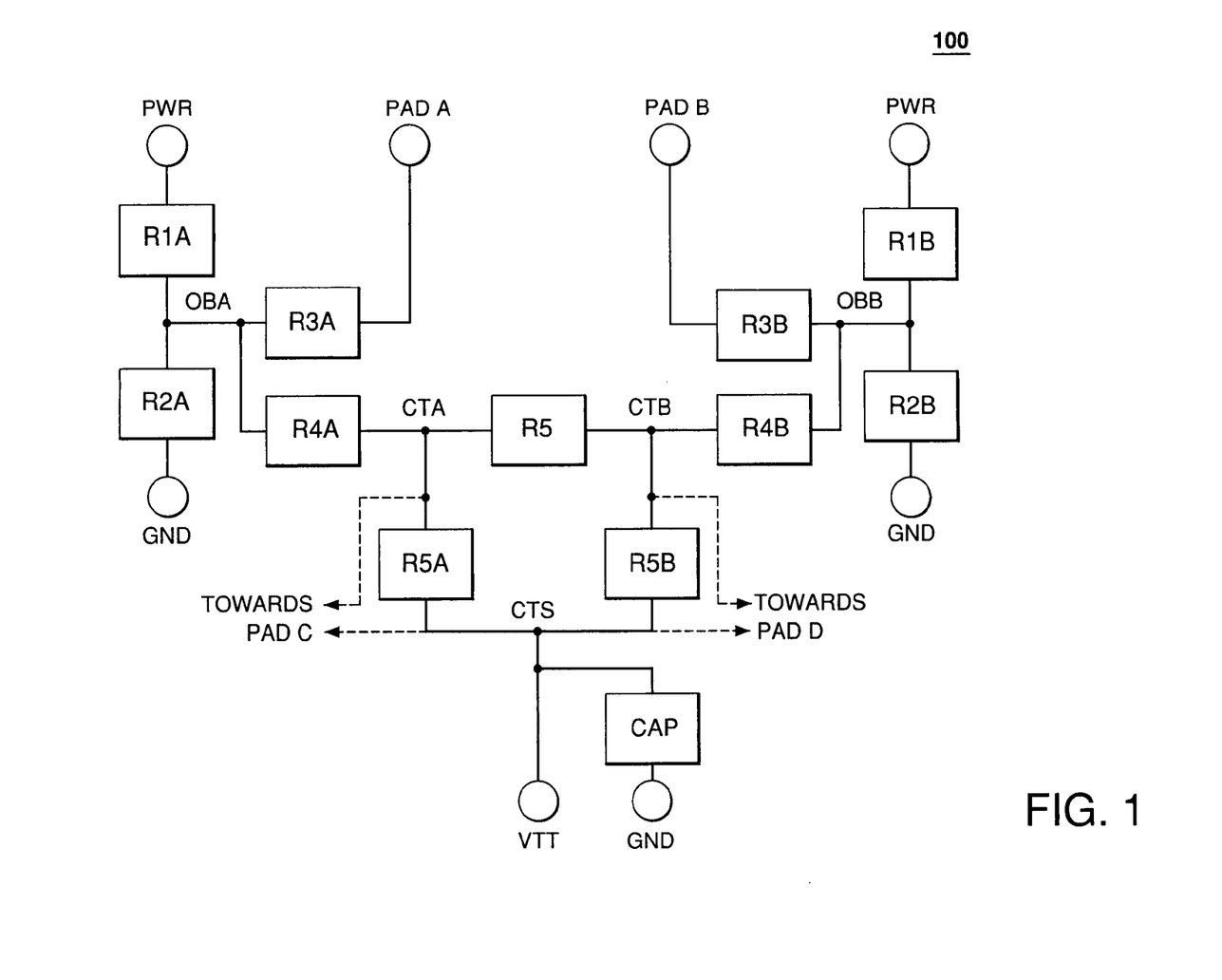
FIG. 1 shows a block diagram of the architecture of a programmable termination structure for a programmable integrated circuit, such as an FPGA, according to one embodiment of the present invention.

In another embodiment, the present invention is an integrated circuit having a programmable termination structure (e.g., 100) for a first pad (e.g., PAD A), the termination structure comprising a first termination circuit (e.g., R1A-R5A) associated with the first pad. The first termination circuit supports at least one termination scheme (e.g., R3A, R4A, R5A) between the first pad and a user-defined node (e.g., VTT), and the termination structure comprises an on-chip capacitor (e.g., CAP) connected to the user-defined node such that first pad is connected via the at least one termination scheme to the on-chip capacitor.

In yet another embodiment, the present invention is an integrated circuit having a programmable termination structure (e.g., 100) for a first pad (e.g., PAD A), the termination structure comprising a first termination circuit (e.g., R1A-R5A) associated with the first pad. The first termination circuit supports bidirectional signaling at the first pad. The integrated circuit comprises control circuitry that automatically turns on and off a termination scheme for the bidirectional signaling, wherein (1) the control circuitry turns off the termination scheme if an output buffer of the integrated circuit is configured to present outgoing signals at the first pad and (2) the control circuitry turns on the termination scheme if the output buffer is disabled in order to terminate incoming signals received at the first pad.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

FIG. 1 shows a block diagram of the architecture of a programmable termination structure 100 for a programmable integrated circuit (IC), such as an FPGA, according to one embodiment of the present invention. Programmable termination structure 100 may be implemented one or more times in such an IC.

In FIG. 1, PWR and GND represent (user-provided) reference power and ground voltages for the IC, respectively, while PAD A, PAD B, and VTT represents three I/O nodes at which the user may apply incoming signals and/or receive outgoing signals. Device CAP represents an on-chip (possibly programmable) capacitor connected between shared node CTS and ground.

Each of elements R1A-R5A, R1B-R5B, and R5 in structure 100 is a programmable resistor. As used in this specification, the term "programmable resistor" refers to resistive circuitry that can be configured to be on and off. When configured off, a programmable resistor provides effectively infinite resistance. When configured on, a programmable resistor provides a resistance configurably selected from a set of one or more available resistance levels. As described later in reference to FIG. 1, a programmable resistor can be implemented using one or more active, transistor-type devices, such as FETs or transmission gates, connected in parallel. Alternatively, a programmable resistor can be implemented using one or more series combinations, where each series combination includes a non-active (e.g., poly) resistor and a low-impedance switch (e.g., a transistor or transmission gate) that selectively connects or disconnects the circuit path containing the series combination from the rest of the termination structure. In addition, each programmable resistor can be implemented to control the one or more available resistance levels to compensate for process, voltage, and temperature (PVT) changes.

In FIG. 1, programmable resistors R1A-R5A form termination circuitry associated with PAD A, while programmable resistors R1B-R5B form termination circuitry associated with PAD B. Programmable resistor R5, capacitor CAP, and node VTT are shared by both PAD A and PAD B. As indicated in FIG. 1, termination structure 100 might also include connections from node CTS and from each of nodes CTA and CTB to one or more similar sets of termination circuitry associated with other pads (e.g., PAD C, PAD D). As such, the additional sets of termination circuitry may share capacitor CAP and node VTT.

Capacitor CAP of FIG. 1 can be implemented using a parallel combination of switched capacitors that enables different levels of capacitance depending on which set of capacitors are selected. Depending on the implementation, the capacitance may be metal programmable or software programmable. In one possible implementation, programmable capacitor CAP has three capacitors having values of 25 pf, 10 pf, and 5 pf. In this case, depending on which capacitors are selected, CAP can be programmed to provide any of 5 pf, 10 pf, 15 pf, 25 pf, 30 pf, 35 pf, and 40 pf.

Figure 2:
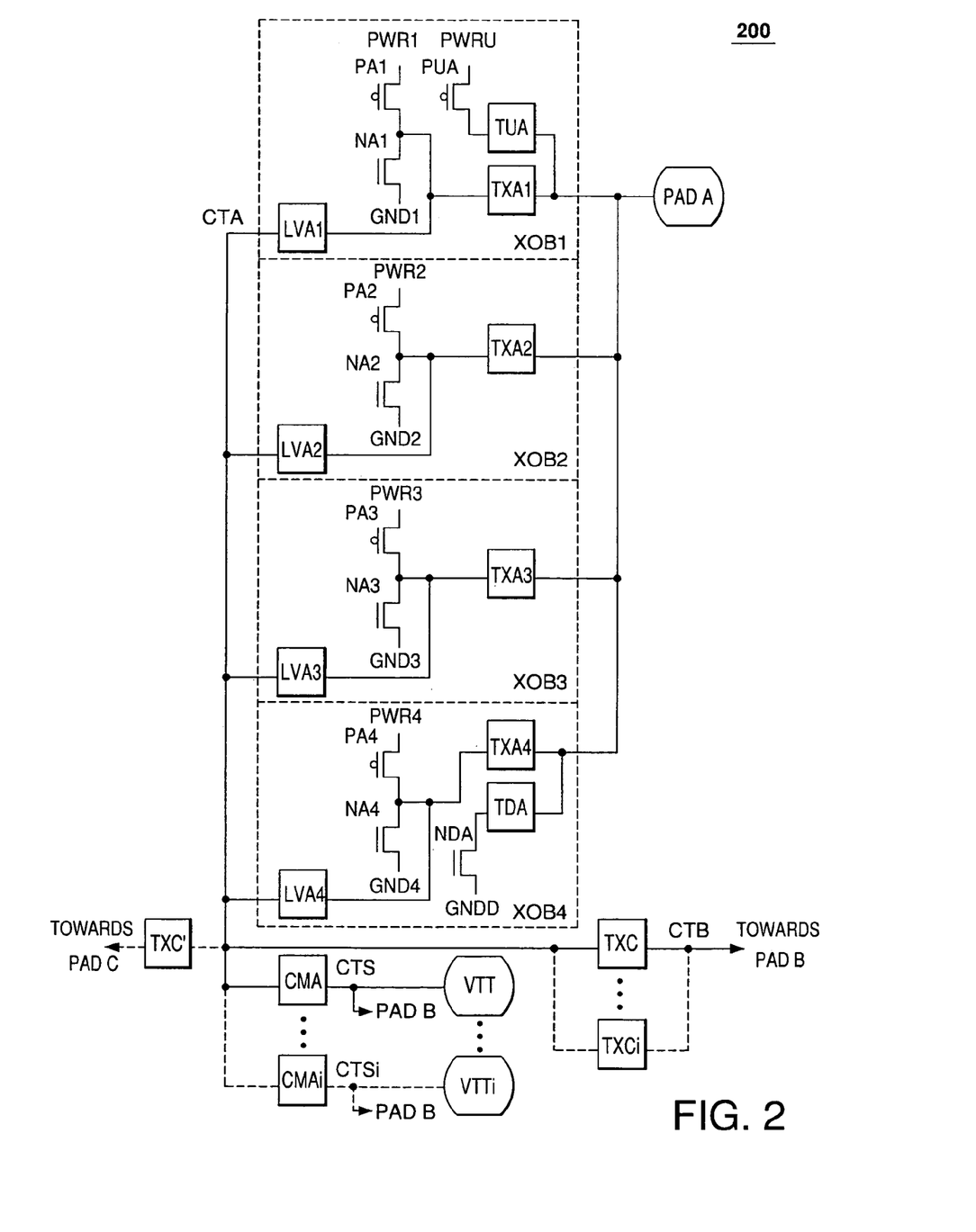
FIG. 2 shows a schematic diagram of an exemplary termination circuitry associated with PAD A that can be used to implement the architecture of the structure of FIG. 1, according to one embodiment of the present invention.

FIG. 2 shows a schematic diagram of exemplary termination circuitry 200 associated with PAD A that can be used to implement the architecture of structure 100 of FIG. 1, according to one embodiment of the present invention. Similar circuitry could be used to implement the termination circuitry associated with PAD B of FIG. 1, which termination circuitry would be able to be controlled independently from termination circuitry 200. In that case, the following discussion of PAD A termination circuitry 200 would also apply to the PAD B circuitry (with corresponding device labels having "B" in place of "A").

Termination circuitry 200 is implemented using four different sets of circuitry (XOB1-XOB4). As described in further detail below, these four sets of circuitry enable termination circuitry 200 to support different termination schemes, each having different levels of resistance by selectively turning on elements in one or more of the sets. In this implementation, the programmable resistors of FIG. 1 are implemented using active, transistor-type devices, such as pFETs, nFETs, and FET-based transmission gates.

In particular, termination circuitry 200 is related to termination structure 100 of FIG. 1 as follows:

Reference power voltage PWR of FIG. 1 is represented in FIG. 2 by reference power voltages PWR1-PWR4 and PWRU. Depending on the particular implementation, anywhere from one to five different reference power voltages can be applied to these five different reference power nodes. For the following discussion, it will be assumed that a single reference power voltage PWR is applied to all five reference power nodes;

Reference ground voltage GND of FIG. 1 is represented in FIG. 2 by reference ground voltages GND1-GND4 and GNDU. Depending on the particular implementation, anywhere from one to five different reference ground voltages can be applied to these five different reference ground nodes. For the following discussion, it will be assumed that a single reference ground voltage GND is applied to all five reference ground nodes;

Programmable resistor R1A of FIG. 1 is implemented using 20-ohm pFET transistors PA1, PA2, PA3, and PA4 of FIG. 2;

Programmable resistor R2A of FIG. 1 is implemented using 20-ohm nFET transistors NA1, NA2, NA3, and NA4 of FIG. 2;

Programmable resistor R3A of FIG. 1 is implemented using 80-ohm transmission gates TXA1, TXA2, TXA3, and TXA4 of FIG. 2;

Programmable resistor R4A of FIG. 1 is implemented using 120-ohm transmission gates LVA1, LVA2, LVA3, and LVA4 of FIG. 2;

Programmable resistor R5A of FIG. 1 is implemented using transmission gate CMA of FIG. 2. Note that termination circuitry 200 can optionally be implemented with one or more other transmission gates CMAi connected to node CTA and associated with one or more other pads VTTi;

Programmable resistor R5 of FIG. 1 is implemented using transmission gate TXC of FIG. 2. Note that termination circuitry 200 can optionally be implemented with one or more other transmission gates TXCi connected in parallel with TXC.

For increased termination flexibility, circuitry set XOB1 includes 20-ohm pFET PUA and 100-ohm transmission gate TUA, which provide 120 ohms of additional programmable pull-up resistance between PAD A and PWR, and circuitry set XOB4 includes 20-ohm nFET ND and 100-ohm transmission gate TDA, which provide 120 ohms of additional programmable pull-down resistance between PAD A and GND. As indicated in FIG. 2, termination circuitry 200 can optionally be implemented with a connection to a transmission gate TXC' of termination circuitry associated with another pad (e.g., PAD C). In alternative embodiments, pad termination circuitry can be implemented with different numbers of circuitry sets having elements with different resistance levels, using either a transistor, a transmission gate, or a poly resistor for each element.

Different levels of resistance can be achieved by turning on different numbers of associated elements. For example, programmable resistor R1A of FIG. 1 can be programmed to provide any of:

20 ohms of resistance by turning on only one of 20-ohm transistors PA1, PA2, PA3, and PA4 of FIG. 2;

10 ohms of resistance by turning on only two of 20-ohm transistors PA1, PA2, PA3, and PA4 of FIG. 2;

6.7 ohms of resistance by turning on only three of 20-ohm transistors PA1, PA2, PA3, and PA4 of FIG. 2; and 5 ohms of resistance by turning on all four of 20-ohm transistors PA1, PA2, PA3, and PA4 of FIG. 2.

Similarly, programmable resistor R2A of FIG. 1 can be programmed to provide any of:

20 ohms of resistance by turning on only one of 20-ohm transistors NA1, NA2, NA3, and NA4 of FIG. 2;

10 ohms of resistance by turning on only two of 20-ohm transistors NA1, NA2, NA3, and NA4 of FIG. 2;

6.7 ohms of resistance by turning on only three of 20-ohm transistors NA1, NA2, NA3, and NA4 of FIG. 2; and 5 ohms of resistance by turning on all four of 20-ohm transistors NA1, NA2, NA3, and NA4 of FIG. 2.

Similarly, programmable resistor R3A of FIG. 1 can be programmed to provide any of:

80 ohms of resistance by turning on only one of 80-ohm transmission gates TXA1, TXA2, TXA3, and TXA4 of FIG. 2;

40 ohms of resistance by turning on only two of 80-ohm transmission gates TXA1, TXA2, TXA3, and TXA4 of FIG. 2;

26.7 ohms of resistance by turning on only three of 80-ohm transmission gates TXA1, TXA2, TXA3, and TXA4 of FIG. 2; and 20 ohms of resistance by turning on all four of 80-ohm transmission gates TXA1, TXA2, TXA3, and TXA4 of FIG. 2.

Similarly, programmable resistor R4A of FIG. 1 can be programmed to provide any of:

120 ohms of resistance by turning on only one of 120-ohm transmission gates LVA1, LVA2, LVA3, and LVA4 of FIG. 2;

60 ohms of resistance by turning on only two of 120-ohm transmission gates LVA1, LVA2, LVA3, and LVA4 of FIG. 2;

40 ohms of resistance by turning on only three of 120-ohm transmission gates LVA1, LVA2, LVA3, and LVA4 of FIG. 2; and 30 ohms of resistance by turning on all four of 120-ohm transmission gates LVA1, LVA2, LVA3, and LVA4 of FIG. 2.

Although not indicated in FIG. 2, in one implementation, transmission gate CMA is limited to selectively providing either 50 ohms or 10 ohms of resistance when it is turned on, and transmission gate TXC provides 10 ohms of resistance when it is turned on.

Although not shown in FIG. 2, in one implementation, each of PAi, NAi, LVAi, PUA, and NDA is controlled to maintain their resistance levels with changes in PVT conditions, while TXA1, TUA, TDA, CMAi, and TXCi are not PVT-controlled. In other implementations, different sets of devices can be adjusted for PVT variation, including implementations in which all of the devices are PVT-controlled.

Termination circuitry 200 can be programmed to support a number of different termination schemes available using termination structure 100 of FIG. 1, including (but not limited to):

(A) Single-ended non-thevenin pull-up termination (i.e., from pad to power);

(B) Single-ended non-thevenin pull-down termination (i.e., from pad to ground);

(C) Single-ended non-thevenin user-defined termination (i.e., from pad to VTT);

(D) Single-ended thevenin termination (e.g., from pad to at least two different reference voltages, such as power and ground);

(E) Differential termination without capacitance; and (F) Differential termination with capacitance.

The term "thevenin termination" refers to a termination scheme in which a pad is simultaneously connected to two or more different reference voltages through two or more corresponding impedances to provide a thevenin-equivalent to an analogous non-thevenin circuit. A non-thevenin termination typically uses less power than an analogous equivalent termination.

The following sections provide at least one example of a configuration of termination circuitry 200 that supports each of these different termination schemes.

Scheme A: Single-Ended Non-Thevenin Pull-Up Termination 120-ohm single-ended non-thevenin pull-up termination from PAD A to PWR can be achieved by turning on TUA and PUA.

100-ohm single-ended non-thevenin pull-up termination from PAD A to PWR can be achieved by turning on TXA1 and PA1.

50-ohm single-ended non-thevenin pull-up termination from PAD A to PWR can be achieved by turning on TXA1, PA1, TXA2, and PA2.

33.3-ohm single-ended non-thevenin pull-up termination from PAD A to PWR can be achieved by turning on TXA1, PA1, TXA2, PA2, TXA3, and PA3.

25-ohm single-ended non-thevenin pull-up termination from PAD A to PWR can be achieved by turning on TXA1, PA1, TXA2, PA2, TXA3, PA3, TXA4, and PA4.

Other resistance levels are also available by turning on the TUA/PUA pair with one or more TXAi/PAi pairs.

Scheme B: Single-Ended Non-Thevenin Pull-Down Termination 120-ohm single-ended non-thevenin pull-down termination from PAD A to GND can be achieved by turning on TDA and NDA.

100-ohm single-ended non-thevenin pull-down termination from PAD A to GND can be achieved by turning on TXA1 and NA1.

50-ohm single-ended non-thevenin pull-down termination from PAD A to GND can be achieved by turning on TXA1, NA1, TXA2, and NA2.

33.3-ohm single-ended non-thevenin pull-down termination from PAD A to GND can be achieved by turning on TXA1, NA1, TXA2, NA2, TXA3, and NA3.

25-ohm single-ended non-thevenin pull-down termination from PAD A to GND can be achieved by turning on TXA1, NA1, TXA2, NA2, TXA3, NA3, TXA4, and NA4.

Other resistance levels are also available by turning on the TDA/NDA pair with one or more TXAi/NAi pairs.

Scheme C: Single-Ended Non-Thevenin User-Defined Termination 250-ohm single-ended non-thevenin user-defined termination from PAD A to VTT can be achieved by turning on TXA1, LVA1, and CMA (configured at 50 ohms), where node VTT can be used to terminate a user-supplied reference voltage, such as half the power supply voltage (i.e., PWR/2).

210-ohm single-ended non-thevenin user-defined termination from PAD A to VTT can be achieved by turning on TXA1, LVA1, and CMA (configured at 10 ohms).

150-ohm single-ended non-thevenin user-defined termination from PAD A to VTT can be achieved by turning on TXA1, LVA1, TXA2, LVA2, and CMA (configured at 50 ohms).

110-ohm single-ended non-thevenin user-defined termination from PAD A to VTT can be achieved by turning on TXA1, LVA1, TXA2, LVA2, and CMA (configured at 10 ohms).

116.7-ohm single-ended non-thevenin user-defined termination from PAD A to VTT can be achieved by turning on TXA1, LVA1, TXA2, LVA2, TXA3, LVA3, and CMA (configured at 50 ohms).

76.7-ohm single-ended non-thevenin user-defined termination from PAD A to VTT can be achieved by turning on TXA1, LVA1, TXA2, LVA2, TXA3, LVA3, and CMA (configured at 10 ohms).

100-ohm single-ended non-thevenin user-defined termination from PAD A to VTT can be achieved by turning on TXA1, LVA1, TXA2, LVA2, TXA3, LVA3, TXA4, LVA4, and CMA (configured at 50 ohms).

60-ohm single-ended non-thevenin user-defined termination from PAD A to VTT can be achieved by turning on TXA1, LVA1, TXA2, LVA2, TXA3, LVA3, TXA4, LVA4, and CMA (configured at 10 ohms).

Scheme D: Single-Ended Thevenin Termination 60-ohm single-ended thevenin termination from PAD A to both PWR and GND can be achieved by turning on TUA, PUA, TDA, and NDA.

50-ohm single-ended thevenin termination from PAD A to both PWR and GND can be achieved by turning on TXA1, PA1, TXA3, and NA3. Note that this termination scheme is a thevenin equivalent to a 50-ohm non-thevenin termination from PAD A to a voltage of PWR/2. As such, this termination scheme can be achieved without requiring the user to provide a separate reference voltage of PWR/2 (e.g., at VTT).

25-ohm single-ended thevenin termination from PAD A to both PWR and GND can be achieved by turning on TXA1, PA1, TXA2, PA2, TXA3, NA3, PXA4, and NA4.

Many other resistance levels can be achieved by turning on different combinations of resistive pairs.

Single-ended thevenin termination can also be achieved from PAD A (i) to both PWR and VTT, (ii) to both VTT and GND, or (iii) to PWR, VTT, and GND by appropriately configuring LVA1-4 and CMA along with the other elements. For example, single-ended thevenin termination from PAD A to both PWR and VTT can be achieved by turning on TXA1, PA1, TXA2, LVA2, and CMA. Similarly, single-ended thevenin termination from PAD A to both VTT and GND can be achieved by turning on TXA1, NA1, TXA2, LVA2, and CMA. Lastly, single-ended thevenin termination from PAD A to PWR, VTT, and GND can be achieved by turning on TXA1, PA1, TXA2, LVA2, CMA, TXA3, and NA3.

Scheme E: Differential Termination Without Capacitance 410-ohm differential termination between PAD A and PAD B without capacitance can be achieved by turning on TXA1, LVA1, and TXC of FIG. 2 along with analogous elements TXB1 and LVB1 (not shown) of the PAD B termination circuitry.

210-ohm differential termination between PAD A and PAD B without capacitance can be achieved by turning on TXA1, LVA1, TXA2, LVA2, and TXC of FIG. 2 along with analogous elements TXB1, LVB1, TXB2, and LVB2 (not shown) of the PAD B termination circuitry.

143.3-ohm differential termination between PAD A and PAD B without capacitance can be achieved by turning on TXA1, LVA1, TXA2, LVA2, TXA3, LVA3, and TXC of FIG. 2 along with analogous elements TXB1, LVB1, TXB2, LVB2, TXB3, and LVB3 (not shown) of the PAD B termination circuitry.

110-ohm differential termination between PAD A and PAD B without capacitance can be achieved by turning on TXA1, LVA1, TXA2, LVA2, TXA3, LVA3, TXA4, LVA4, and TXC of FIG. 2 along with analogous elements TXB1, LVB1, TXB2, LVB2, TXB3, LVB3, TXB4, and LVB4 (not shown) of the PAD B termination circuitry.

Other resistance levels can be achieved by turning on a set of elements in the PAD A termination circuitry different from the set of elements turned on in the PAD B termination circuitry. For example, 310-ohm differential termination between PAD A and PAD B without capacitance can be achieved by turning on only TXA1, LVA1, and TXC of FIG. 2 along with elements TXB1, LVB1, TXB2, and LVB2 (not shown) of the PAD B termination circuitry.

Scheme F: Differential Termination With Capacitance

Analogous differential termination schemes as listed in the previous section can be achieved with capacitance using the same configurations, except with (i) TXC is turned off and (ii) CMA and CMB (not shown) are both turned on (and configured at 10 ohms). Additional resistance levels can be achieved by configuring one or both of CMA and CMB at 50 ohms.

In addition to the capacitance provided by on-chip capacitor CAP, additional capacitance can be applied by connecting node VTT to an external capacitor.

Note that at least one transmission gate TXAi is used in most of these different termination schemes. Only the 120-ohm single-ended non-thevenin pull-up and pull-down termination schemes (which employ only the TUA/PUA pair or the TDA/NDA pair) do not employ at least one TXAi element. This sharing of devices saves area compared to other termination structures that do not employ such device sharing.

Note that, when termination circuitry 200 is configured to provide one of the single-ended termination schemes for PAD A, PAD B can be simultaneously and independently configured to provide any of the single-ended termination schemes.

As mentioned previously, in the implementation of FIG. 2, PA1, for example, is adjusted for PVT variation, while TXA1 is not. Nevertheless, the PVT control monitors the entire path of both TXA1 and PA1 and then compensates only PA1 to adjust the entire path from PAD A to PWR. The same holds true when programming the path from PAD A to GND through TXA1 and NA1 (since NA1 is PVT-controlled) or the path from PAD A to VTT through TXA1, LVA1, and CMA (since LVA1 is PVT-controlled).

Dynamic Termination Control

As mentioned previously, some signaling schemes involve dynamic control of termination for bidirectional signaling, where the termination is turned off when the output driver is driving the pad with an outgoing signal, and the termination is turned on when the output driver is not driving the pad, during which time the pad is available to receive an externally generated incoming signal.

Referring to FIG. 2, assume, for example, that PAD A is to be driven by an output buffer formed by transistors PA1, NA1, PA2, and NA2. In that case, transmission gates TXA1 and TXA2 are enabled (i.e., turned on), transmission gates TUA, TXA3, TXA4, and TDA are disabled (i.e., turned off), and the gates of PA1, NA1, PA2, and NA2 are driven by signals that control whether the output buffer drives PAD A high (i.e., towards PWR with PA1/PA2 on and NA1/NA2 off) or low (i.e., towards GND with PA1/PA2 off and NA1/NA2 on).

For bidirectional signaling, during some time intervals, the output buffer drives PAD A with an outgoing signal, and, during other time intervals, PAD A is driven by an externally generated incoming signal. When the output buffer is not driving PAD A, the output buffer is tri-stated (i.e., PA1, NA1, PA2, and NA2 are all turned off). When the output buffer is tri-stated, PAD A is available to receive an incoming signal, which typically requires a specified termination scheme. Assume, for example, that the termination required by the incoming signal involves driving PAD A to node VTT through TXA 14, LVA14, and CMA.

Figure 3:
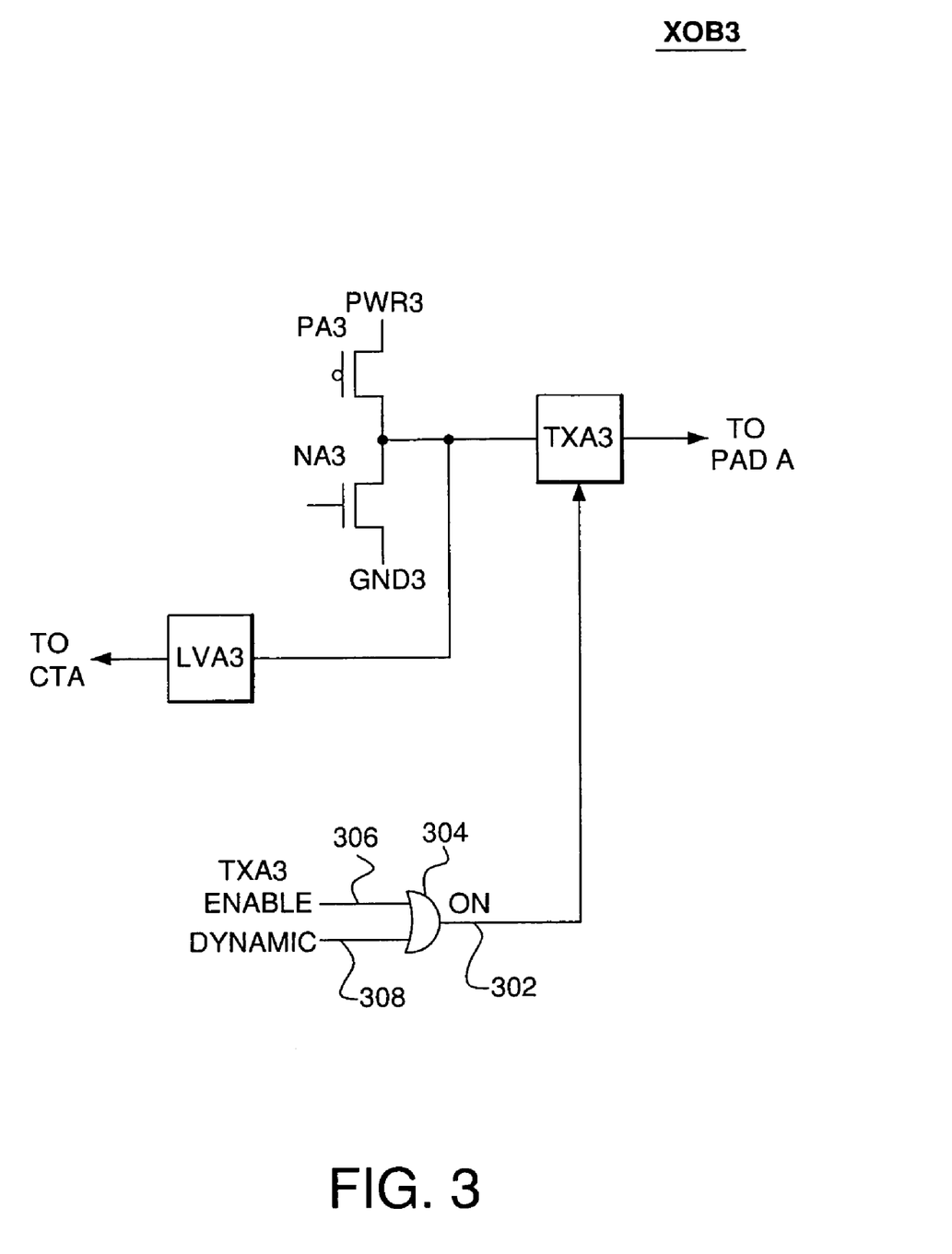
FIG. 3 shows a schematic diagram of circuit set XOB3 of FIG. 2, according to one embodiment of the present invention.

FIG. 3 shows a schematic diagram of circuit set XOB3 of FIG. 2, according to one embodiment of the present invention. FIG. 3 shows circuitry used to generate control signal 302, which turns on and off transmission gate TXA3. In particular, OR gate 304 receives two inputs: a TXA3 enable signal 306 and a dynamic-mode control signal 308. If either (or both) of these two inputs is high, then control signal 302 will be high and TXA3 will be on. If both inputs are low, then control signal 302 will be low and TXA3 will be off.

When termination circuit 200 of FIG. 2 is configured for non-dynamic termination, dynamic-mode control signal 308 is low, and TXA3 enable signal 306 dictates whether TXA3 is on or off. When termination circuit 200 is configured for dynamic termination, if the output buffer does not include PA3 and NA3, then TXA3 enable signal 306 will be low. This ensures that NA3 and PA3 will not be included in the output buffer. Nevertheless, if TXA3 and LVA3 are needed to terminate the incoming signal applied to PAD A (i.e., when the output buffer is tri-stated), then dynamic-mode control signal 308 can be used to turn on TXA3 (rather than having to change TXA3 enable signal 306). In particular, dynamic-mode control signal 308 can be based on the same control signal used to tri-state the output buffer. In this case, whenever the output buffer is tri-stated, dynamic-mode control signal 308 will be high and TXA3 will be turned on. On the other hand, whenever the output buffer is not tri-stated, dynamic-mode control signal 308 will be low, and TXA3 enable signal 306 will dictate whether TXA3 is on or off. Similar control circuitry can be implemented to provide dynamic termination control for TXA1, TXA2, and TXA4. In alternative implementations, a suitable control signal other than the tri-state control signal can be used to provide dynamic termination control.

Although the present invention has been described in the context of FPGAs, those skilled in the art will understand that the present invention can be implemented in the context of other types of programmable devices, such as, without limitation, programmable logic devices (PLDs), mask-programmable gate arrays (MPGAs), simple programmable logic device (SPLDs), and complex programmable logic devices (CPLDs). More generally, the present invention can be implemented in the context of any kind of electronic device having programmable elements.

It will be further understood that various changes in the details, materials, and arrangements of the parts which have been described and illustrated in order to explain the nature of this invention may be made by those skilled in the art without departing from the scope of the invention as expressed in the following claims. For example, active, transistor-type devices can be implemented using devices other than FETs, such as other types of MOS devices or bipolar devices.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

We claim:

1. An integrated circuit having a programmable termination structure for a first pad and a second pad, the termination structure comprising:
   a first termination circuit associated with the first pad;
   a second termination circuit associated with the second pad;
   a programmable connection between the first and second termination circuits, wherein:
   the first termination circuit is adapted to support first and second sets of termination schemes;
   the first set of termination schemes comprises one or more of:
      at least one single-ended non-thevenin pull-up termination between the first pad and a reference power voltage;
      at least one single-ended non-thevenin pull-down termination between the first pad and a reference ground node; and
      at least one single-ended thevenin termination between the first pad and (i) the reference power node and (ii) the reference ground node;
   the second set of termination schemes comprises one or more of:
      at least one single-ended non-thevenin user-defined termination between the first pad and a user-defined node;
      at least one single-ended thevenin termination between the first pad and (i) the user-defined node and (ii) at least one of the reference power node and the reference ground node; and
      at least one differential termination between the first and second pads; and
   the first termination circuit comprises a shared resistor that is part of at least one termination scheme in the first set and at least one termination scheme in the second set.

2. The invention of claim 1, wherein the shared resistor is a programmable resistor.

3. The invention of claim 1, wherein:
   the first set of termination schemes comprises each of:
      at least one single-ended non-thevenin pull-up termination between the first pad and the reference power voltage;
      at least one single-ended non-thevenin pull-down termination between the first pad and the reference ground node; and
      at least one single-ended thevenin termination between the first pad and (i) the reference power node and (ii) the reference ground node; and
   the second set of termination schemes comprises each of:
      at least one single-ended non-thevenin user-defined termination between the first pad and the user-defined node;
      at least one single-ended thevenin termination between the first pad and (i) the user-defined node and (ii) at least one of the reference power node and the reference ground node; and
      at least one differential termination between the first and second pads.

4. The invention of claim 3, wherein the shared resistor is part of:
   at least one single-ended non-thevenin pull-up termination between the first pad and the reference power voltage;

at least one single-ended non-thevenin pull-down termination between the first pad and the reference ground node;

at least one single-ended thevenin termination between the first pad and (i) the reference power node and (ii) the reference ground node;

at least one single-ended non-thevenin user-defined termination between the first pad and the user-defined node;

at least one single-ended thevenin termination between the first pad and (i) the user-defined node and (ii) at least one of the reference power node and the reference ground node; and at least one differential termination between the first and second pads.

5. The invention of claim 1, wherein the shared resistor is part of a termination scheme of the first set between the first pad and an other node in which the total resistance between the first pad and the other node comprises the shared resistor and an other resistor, where the other resistor is not part of at least one termination scheme of the second set.

6. The invention of claim 1, wherein the shared resistor is part of a termination scheme of the second set between the first pad and an other node in which the total resistance between the first pad and the other node comprises the shared resistor and an other resistor, where the other resistor is not part of at least one termination scheme of the first set.

7. The invention of claim 1, wherein:
a first other programmable resistor is connected between the shared programmable resistor and the reference power node;
a second other programmable resistor is connected between the shared programmable resistor and the reference ground node; and
a third other programmable resistor is connected between the shared programmable resistor and both the second pad and the user-defined node.

8. The invention of claim 1, wherein the termination structure comprises an on-chip capacitor connected to the user-defined node.

9. The invention of claim 8, wherein the on-chip capacitor is a programmable capacitor.

10. The invention of claim 8, wherein the user-defined node is adapted to be connected to an external capacitor.

11. The invention of claim 1, wherein the termination structure is adapted to support bidirectional signaling at the first pad, wherein:
the termination structure comprises control circuitry adapted to automatically turn on and off a termination scheme for the bidirectional signaling, wherein:
the control circuitry is adapted to turn off the termination scheme if an output buffer of the integrated circuit is configured to present outgoing signals at the first pad;
the control circuitry is adapted to turn on the termination scheme if the output buffer is disabled in order to terminate incoming signals received at the first pad.

12. The invention of claim 1, wherein the first termination circuit comprises:
a first programmable resistor connected between the reference power node and a first node;
a second programmable resistor connected between the first node and the reference ground node;
a third programmable resistor connected between the first node and the first pad;

a fourth programmable resistor connected between the first node and a second node; and
a fifth programmable resistor connected between the second node and a third node; and
the programmable connection is a programmable resistor connected between the second node and the second termination circuit.

13. The invention of claim 12, wherein:
each of the first, second, third, fourth, and fifth programmable resistors comprises a plurality of active, transistor-type devices connected in parallel; and
the programmable connection comprises at least one active, transistor-type device.

14. The invention of claim 12, further comprising an on-chip capacitor connected between the third node and the reference ground node.

15. The invention of claim 12, wherein:
each of the first, second, and fourth programmable resistors is PVT controlled; and
each of the third and fifth programmable resistors and the programmable connection is not PVT controlled.

16. The invention of claim 1, wherein the first termination circuit comprises a plurality of independently controllable sets of termination circuitry connected in parallel.

17. The invention of claim 16, wherein each set of termination circuitry comprises:
a p-type transistor connected between the reference power node and a first node;
an n-type transistor connected between the first node and the reference ground node;
a first transmission gate connected between the first node and the first pad; and
a second transmission gate connected between the first node and a second node.

18. The invention of claim 17, wherein:
a first set of termination circuitry further comprises an additional programmable pull-up resistor connected between the reference power node and the first pad; and
a last group of termination circuitry further comprises an additional programmable pull-down resistor connected between the reference ground node and the first pad.

19. The invention of claim 1, wherein the integrated circuit is an FPGA.

20. An integrated circuit having a programmable termination structure for a first pad, the termination structure comprising a first termination circuit associated with the first pad, wherein:
the first termination circuit is adapted to support at least one termination scheme between the first pad and a user-defined node, wherein the user-defined node is an input/output (I/O) pad of the integrated circuit at which a user may apply an incoming signal or receive an outgoing signal; and
the termination structure comprises an on-chip capacitor connected to the user-defined node such that first pad is connected via the at least one termination scheme to the on-chip capacitor.

21. The invention of claim 20, wherein the on-chip capacitor is connected between the user-defined node and a reference ground node.

22. The invention of claim 20, wherein the on-chip capacitor is a programmable capacitor.

23. The invention of claim 20, wherein the user-defined node is adapted to be connected to an external capacitor.

24. The invention of claim 20, wherein the termination structure further comprises:

a second termination circuit associated with a second pad;
a programmable connection between the first and second termination circuits, wherein
the second termination circuit is adapted to support at least one termination scheme between the second pad and the user-defined node such that the second pad is connected via the at least one termination scheme to the on-chip capacitor.

25. The invention of claim 24, wherein the first and second termination circuits are adapted to support a differential termination scheme between the first and second pads via the user-defined node such that the first and second pads are both connected via the differential termination scheme to the on-chip capacitor.

26. The invention of claim 20, wherein the first termination circuit is adapted to support:
at least one single-ended non-thevenin user-defined termination between the first pad and the user-defined node;
at least one single-ended thevenin termination between the first pad and (i) the user-defined node and (ii) at least one of the reference power node and the reference ground node; and
at least one differential termination between the first pad and a second pad via the user-defined node.

27. An integrated circuit having a programmable termination structure for a first pad, the termination structure comprising a first termination circuit associated with the first pad, wherein:
the first termination circuit is adapted to support bidirectional signaling at the first pad;
the integrated circuit comprises control circuitry adapted to automatically turn on and off a termination scheme for the bidirectional signaling, wherein:
the control circuitry is adapted to turn off the termination scheme if an output buffer of the integrated circuit is configured to present outgoing signals at the first pad;
the control circuitry is adapted to turn on the termination scheme if the output buffer is disabled in order to terminate incoming signals received at the first pad; and
the control signal is based on an on-chip tri-state control signal also used to control the output buffer.

28. The invention of claim 27, wherein the output buffer comprises one or more programmable resistors that are also part of one or more programmable termination schemes supported by the first termination circuit.

29. The invention of claim 28, wherein the output buffer comprises:
a first programmable resistor connected between a reference power node and a first node;
a second programmable resistor connected between the first node and a reference ground node; and
a third programmable resistor connected between the first node and the first pad, wherein the third programmable resistor forms part of the termination scheme for the bidirectional signaling.

30. The invention of claim 28, wherein:
each programmable resistor is adapted to be configured on and off;
if configured off, the programmable resistor provides effectively infinite resistance; and
if configured on, the programmable resistor provides a resistance configurably selected from a set of one or more available resistance levels.

* * * * *